United States Patent [19]
Ohhinata

[11] 4,112,315
[45] Sep. 5, 1978

[54] SEMICONDUCTOR SWITCH CIRCUIT

[75] Inventor: Ichiro Ohhinata, Yokohama, Japan

[73] Assignee: Hitachi, Ltd., Japan

[21] Appl. No.: 720,759

[22] Filed: Sep. 7, 1976

[30] Foreign Application Priority Data

Sep. 8, 1975 [JP] Japan .............................. 50-108714
Sep. 8, 1975 [JP] Japan .............................. 50-108715
Sep. 10, 1975 [JP] Japan .............................. 50-108969

[51] Int. Cl.² ...................... H03K 17/72; H03K 17/60
[52] U.S. Cl. .............................. 307/254; 307/252 A;
307/252 G; 307/252 J; 307/305; 307/252 D;
307/252 C
[58] Field of Search ................... 307/253, 252, 252 A,
307/252 R, 252 C, 252 D, 252 G, 252 J, 305,
315, 254, 255

[56] References Cited
U.S. PATENT DOCUMENTS

| | | | |
|---|---|---|---|
| 3,526,787 | 9/1970 | Stover | 307/253 X |
| 3,590,339 | 6/1971 | Bilo et al. | 307/305 X |
| 3,619,652 | 11/1971 | Ogle | 307/305 X |
| 3,660,698 | 5/1972 | Schisselbauer | 307/252 J |
| 3,708,672 | 1/1973 | Marinkovic | 307/252 A |

Primary Examiner—John Zazworsky
Attorney, Agent, or Firm—Craig & Antonelli

[57] ABSTRACT

A semiconductor switch circuit comprises a PNPN switch with a gate terminal and having an equivalently four-layered PNPN structure, and a load-current-dividing circuit including at least a transistor. The base and the collector of the transistor included in the load-current-dividing circuit are connected to the cathode and the anode of the PNPN switch, respectively. The load current is divided into two parts of the current. One part of the load current flows into the base of the transistor through the anode and the cathode of the PNPN switch, while the remaining part of the load current flows into the collector of the transistor. Since the greater part of the load current flows into the collector of the transistor, the PNPN switch is not burdened with a large current. Thus, the semiconductor switch circuit permits the gate turn-off operation of the PNPN switch with a self-holding ability, thereby making it possible to cut off a large current.

8 Claims, 12 Drawing Figures

FIG. 7
FIG. 8
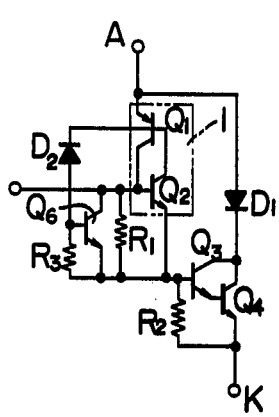
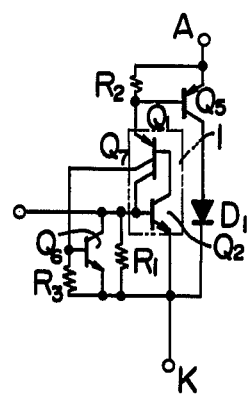
FIG. 9
FIG. 10
FIG. 11
FIG. 12
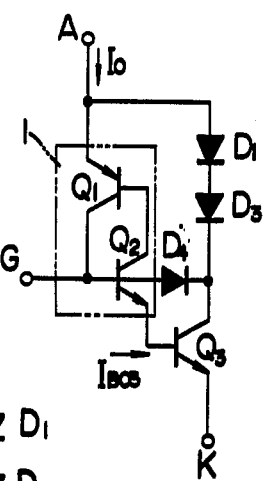
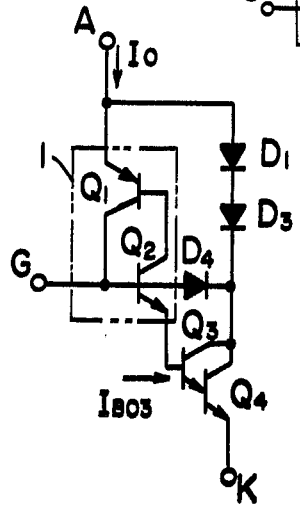
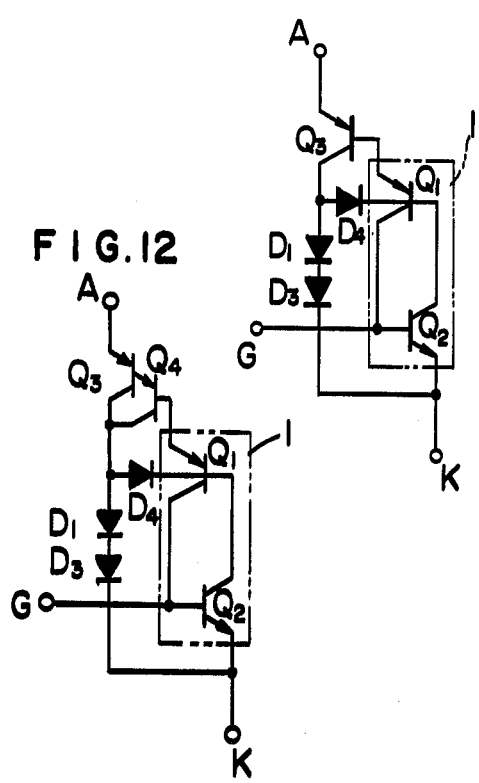

SEMICONDUCTOR SWITCH CIRCUIT

BACKGROUND OF THE INVENTION

1. Field of the Invention

This invention relates to a semiconductor switch circuit including a PNPN switch which can be used as a switching element for a control device and is capable of making the gate turn-off operation with small control power.

2. Description of the Prior Art

A PNPN switch with a gate terminal has the advantages that a large current can be controlled by a small gate drive current, that it has a self-holding ability and that a high breakdown voltage is obtained in both directions. Thus, it is used with various control circuits. There are two methods of cutting off this PNPN switch having the self-holding ability. One is to cut off the main current, and the other to apply a negative current to the gate thereof. The former method is employed for the commonly-used PNPN switches, and one of the PNPN switches designed to facilitate the introduction of the latter method is a gate turn-off thyristor (hereinafter referred to as the GTOSCR). The turn-off gain $G_{OFF}$ (the ratio between the load current and the current required for the gate turn-off operation of the GTOSCR) of the GTOSCR is expressed as $\alpha_2/(\alpha_1 + \alpha_2 - 1)$ for the P gate, where $\alpha_1$ is the current gain of the PNP portion of the four-layered PNPN structure and $\alpha_2$ the current gain of the NPN portion thereof. In order to increase the value of $G_{OFF}$, it is necessary to make the value of $\alpha_2$ as large as possible and the value of $(\alpha_1 + \alpha_2)$ slightly larger than 1. In the GTOSCR, the current gain of the PNP portion must be reduced as much as possible, while the current gain of the NPN portion must be increased as much as possible. For this purpose, it is necessary to selectively diffuse gold only into the N base layer. If the lateral resistance of the gate layer (P base layer) is large, on the other hand, the voltage drop across this resistance causes a forward bias to be automatically applied between the gate and the cathode of the GTOSCR. To cut off the large load current under this condition, a very large negative current must be applied to the gate and, therefore, the large control power is required. The conventional method of minimizing such a resistance is to construct the gate electrode in such a special shape as a ring or comb.

Another disadvantage of the conventional PNPN switch is that a turn-off time is delayed because the PNP and NPN transistor portions thereof are generally deeply saturated during the ON state of the PNPN switch.

SUMMARY OF THE INVENTION

An object of this invention is to provide a semiconductor switch circuit capable of making a gate turn-off operation for cutting off a large load current by the use of a commonly-used PNPN switch.

Another object of the invention is to provide a semiconductor switch circuit capable of making a gate turn-off operation for cutting off a large load current by the use of a commonly-used PNPN switch for a short turn-off time.

Still another object of the invention is to provide a semiconductor switch circuit with high $dv/dt$-immunity, which is capable of making a gate turn-off operation for cutting off a large load current by the use of a commonly-used PNPN switch and which is also suitable for the application involving a small load current.

According to the present invention, there is provided a semiconductor switch circuit comprising a PNPN switch of an equvalently four-layered PNPN structure and a load-current-dividing circuit including at least a transistor. The PNPN switch is connected to the transistor in such a way that the current flowing through the anode and the cathode of the PNPN switch flows into the base of the transistor. Either the anode or the cathode of the PNPN switch is connected to the collector of the transistor.

BRIEF DESCRIPTION OF THE DRAWINGS

FIGS. 2, 3, 4, 5, 6, 7, 8 and 9 are equivalent circuit diagrams showing other embodiments of the semiconductor switch circuit according to the present invention.

FIG. 10 is a diagram showing an equivalent circuit which is complementary to the circuit shown in FIG. 9.

FIGS. 11 and 12 are circuit diagrams showing other embodiments of the semiconductor switch circuit having Darlington pair connected transistors according to the present invention.

DESCRIPTION OF THE PREFERRED EMBODIMENTS

Figure 1:
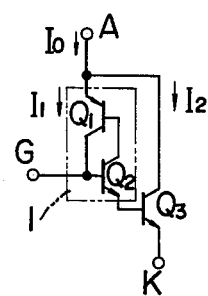
FIG. 1 is an equivalent circuit diagram showing an embodiment of the semiconductor switch circuit according to the present invention.

A diagram showing an equivalent circuit of a first embodiment having the basic construction of the semiconductor switch circuit according to the present invention is illustrated in FIG. 1. In this figure, reference characters $Q_1$ and $Q_2$ designate a PNP transistor and an NPN transistor which constitute the PNPN switch 1, and character $Q_3$ a load-current-dividing NPN transistor connected in such a manner as to be burdened with most of the load current. Character $I_0$ designates a load current flowing through the transistors $Q_1$ and $Q_2$ of the PNPN switch and the transistor $Q_3$, and character $I_1$ one part of current $I_0$, which flows through the PNPN switch 1, and character $I_2$ the other part of current $I_0$, which flows into the collector of the transistor $Q_3$. Assuming that the emitter-grounded current amplification factor of transistor $Q_3$ is $h_{FEQ_3}$. Then, the current $I_1$ that flows into the PNPN switch 1 after the PNPN switch 1 is turned on by applying a gate current to the gate terminal G of the PNPN switch 1 is given as $$I_1 = I_0/(1 + h_{FEQ_3}) \tag{1}$$

It will be seen that if $h_{FEQ_3}$ is sufficiently large, most of the load current $I_0$ flows through the collector of the transistor $Q_3$. As a result, the PNPN switch 1 may be turned off by cutting off the small current $I_1$, thus making possible the gate turn-off operation of the PNPN switch 1 with a small gate turn-off ratio. Further, the failure of the gate turn-off operation which otherwise might result from the effect of the lateral resistance of the P gate layer is avoided.

Reference is made to the transistor $Q_3$ the collector of which allows most of the load current to pass as a collector current. During the ON state, the transistor $Q_3$ is reverse biased by the turn-on voltage of the PNPN switch 1 between the base and collector thereof and thus operated at the active regions thereof. Therefore, the transistor $Q_3$ is cut off immediately when the PNPN switch 1 is turned off. In order to shorten the turn-off time of the transistor $Q_3$, a discharging resistor (not shown in the drawing) may be connected between the base and the emitter thereof, or a circuit for preventing the erroneous firing of the PNPN switch 1 due to the $dv/dt$ effect may be connected between the base and the emitter of the transistor $Q_2$.

Figure 2:
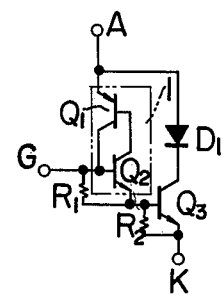

A second embodiment of the semiconductor switch circuit according to the present invention is shown in FIG. 2. Reference characters $Q_1$ and $Q_2$ designate, like in FIG. 1, a PNP transistor and an NPN transistor which constitute the PNPN switch 1, character $Q_3$ a transistor which constitutes a load-current-dividing circuit burdened with most of the load current, character $D_1$ a diode for increasing the reverse breakdown voltage, character $R_1$ a resistor for protecting the circuit from the $dv/dt$ effect, and character $R_2$ a resistor for discharging the transistor $Q_3$. Generally, a PNPN switch is provided with a high breakdown voltage in both directions. When the transistor $Q_3$ is connected between the cathode and anode thereof as shown in FIG. 1, however, the reverse breakdown voltage of the semiconductor switch circuit is reduced. This disadvantage is eliminated by connecting, as shown in FIG. 2, the diode $D_1$ of high breakdown voltage between the collector of the transistor $Q_3$ and the anode of the PNPN switch 1. Further, as a result of insertion of the diode $D_1$, the collector potential of the transistor $Q_3$ is reduced as compared with the case of FIG. 1, so that the transistor $Q_3$ is operated in the neighborhood of the boundary between the active region and the saturated region. Since the transistor $Q_3$ is thus prevented from heavily saturating, the turning-off speed thereof is increased. Further, since most of the load current flows through the transistor $Q_3$, the PNPN switch 1 may be turned off by cutting off the small current $I_1$, thereby making possible the turning-off operation of the PNPN switch with a relatively small gate turn-off ratio. Furthermore, the insertion of resistor $R_2$ causes the discharge of the transistor $Q_3$, thereby shortening the turn-off time thereof.

Figure 3:
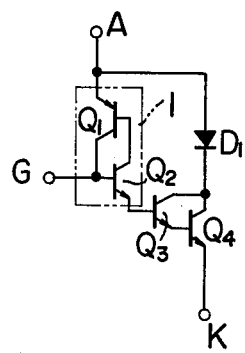

A third embodiment of the semiconductor circuit according to the present invention is shown in FIG. 3. This circuit is suitable for cutting off a greater load current and has a load-current-dividing circuit with transistors $Q_3$ and $Q_4$ connected in Darlington pair. From equation (1) above, the higher is the current amplification factor $h_{FEQ_3}$ of the transistor $Q_3$, the smaller the current flowing through the PNPN switch 1. As well known, the current amplification factor as a whole of the transistors $Q_3$ and $Q_4$ in Darlington pair is the product of the current amplification factors of the respective transistors. Assuming that the emitter-grounded current amplification factor of the transistor $Q_4$ be $h_{FEQ_4}$. The current $I_1$ flowing through the PNPN switch including the transistors $Q_1$ and $Q_2$ is given as $$I_1 \approx I_0/(1 + h_{FEQ_3} \cdot h_{FEQ_4}) \qquad (2)$$

It will be seen that only a small proportion of the load current $I_0$ flows through the PNPN switch 1, thus making possible the gate turn-off operation for a large load current $I_0$.

Figure 4:
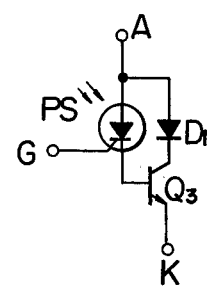

A fourth embodiment of the semiconductor switch circuit using a photo-thyristor PS for a PNPN switch according to the present invention is shown in FIG. 4. In this embodiment, the photo-thyristor PS adapted to be fired under light is combined with the transistor $Q_3$ to facilitate the gate turn-off operation. In other words, most of the load current flows through the collector of the transistor $Q_3$, while only a small current equivalent to the base current of the transistor $Q_3$ flows into the photo-thyristor PS, thus facilitating the gate turn-off operation of the switch. Further, the transistor $Q_3$ is turned off by turning off the photo-thyristor PS, thus making it possible to cut off a large load current.

Figure 5:
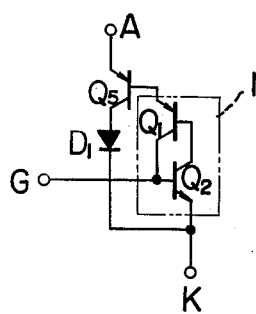

A fifth embodiment of the semiconductor switch circuit according to the present invention is shown in FIG. 5. The anode of the PNPN switch 1 is connected with the base of the PNP transistor $Q_5$ constituting a load-current-dividing circuit. As in the preceding embodiments, only a small amount of current equivalent to the base current of the transistor $Q_5$ flows through the PNPN switch 1, while most of the load current is passed through the transistor $Q_5$ as a collector current. The diode $D_1$, like similar elements in the circuits of FIGS. 2, 3 and 4, compensates for the reduction in the reverse breakdown voltage of the transistor $Q_5$ and increases the same to a level as high as that of the PNPN switch 1. Depending on applications involved, the PNP transistor as shown in FIG. 5 may of course be inserted to form the circuit configuration of either one of the circuit of FIG. 1, the circuit of FIG. 3 with a Darlington pair, or the circuit of FIG. 4 using the photo-thyristor PS.

Figure 6:
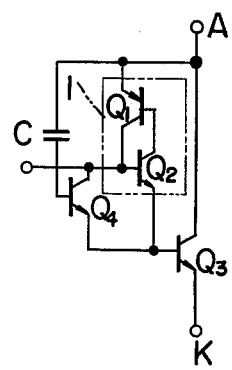

As equivalent circuit of a sixth embodiment of the invention is shown in FIG. 6. Reference characters $Q_1$ and $Q_2$ designate PNP and NPN transistors which constitute the PNPN switch 1, character $Q_3$ a load-current-dividing transistor, character $Q_4$ a transistor constituting a variable impedance bypass circuit for $dv/dt$-immunity and character C a capacitor for driving the $dv/dt$ effect-protecting transistor $Q_4$. During the normal ON state of this circuit configuration, the $dv/dt$ effect-protecting transistor $Q_4$ is not in OFF state as it is not supplied with any base current and, therefore, a high impedance is offered between collector and emitter thereof, thus reducing the minimum holding current of the PNPN switch 1. As a result, this circuit may be used as a switch having self-holding ability at a very lower level of the load current as compared with the circuit configuration of FIGS. 1 to 5. Since most of the load current flows through the collector of the transistor $Q_3$, the gate turn-off operation of the PNPN switch 1 is easily performed at a large load current. Further, the transistor $Q_3$, which is operated at the active region where the reverse bias is applied between the base and collector, is turned off at high speed. When a steeply rising voltage $dv/dt$ is applied between the equivalent anode A and the equivalent cathode K in the OFF state of this circuit, the transistor $Q_4$ is driven through the capacitor C, so that the impedance between the collector and the emitter thereof is reduced to bypass the displacement current flowing through the PN-junction of the PNPN switch 1, thus preventing an erroneous firing of the PNPN switch. Under the normal conditions without any transient voltage being applied, on the other hand, the transistor $Q_4$ is in the OFF state and a high impedance is offered between the collector and the emitter thereof, so that the switch circuit may be turned on by a small current from the gate terminal G.

The variable impedance bypass circuit for $dv/dt$-immunity and the load-current-dividing circuit may be configured in various ways other than shown in FIG. 6.

An example of such configurations is a seventh embodiment of the invention shown in FIG. 7. In this drawing, reference characters $Q_1$ and $Q_2$ designate transistors constituting the PNPN switch, characters $Q_3$ and $Q_4$ transistors connected in Darlington pair for dividing the load current, character $Q_6$ a transistor for protecting the circuit from the $dv/dt$ effect, character $D_1$ a diode for increasing the reverse breakdown voltage of the load-current-dividing circuit, character $D_2$ a diode for driving the $dv/dt$ effect-protecting transistor $Q_6$ capacitively only in response to a transient voltage applied between the anode and the cathode of the switch, character $R_1$ a high resistor for protecting the circuit from a $dv/dt$ effect small enough not to energize the $dv/dt$ effect-protecting transistor, and characters $R_2$ and $R_3$ discharging resistors.

This circuit operates basically in the same way as the circuit of FIG. 6. In other words, most of the load current flows through the load-current-dividing circuit including the transistors $Q_3$ and $Q_4$ and the diode $D_1$, thereby facilitating the gate turn-off operation of the PNPN switch 1. Provision of the variable impedance bypass circuit for $dv/dt$-immunity comprising the transistor $Q_6$, the diode $D_2$ and the resistors $R_1$ and $R_3$ obviates the disadvantage of a large minimum self-holding current required for increasing the $dv/dt$-immunity level by the short-circuiting through a mere resistor. Thus, a switch with self-holding ability can be realized even at a small load current. In this circuit configuration, the use of the transistors $Q_3$ and $Q_4$ connected in Darlington pair for dividing the load current makes possible the gate turn-off operation at a larger load current. Further, by inserting the diode $D_1$ for improving the reverse breakdown voltage, the bidirectional high breakdown voltages, which is one of the features of the PNPN switch, is made effective. Also, since the diode $D_2$ is used for driving the $dv/dt$ effect-protecting transistor $Q_6$, the circuit integration of the semiconductor switch circuit is easily realized. Furthermore, the insertion of the discharging resistor $R_3$ permits the circuit operation at higher operating frequency. One may fear that the insertion of the resistor $R_3$ may make it impossible for the transistor $Q_6$ to be turned on in response to a small drive current from the diode $D_2$ at a small $dv/dt$ level and, therefore, unable to function as a variable impedance bypass circuit. However, protection may be provided by the resistor $R_1$ of a high resistance value against such a small $dv/dt$ effect. Since a resistor of high resistance value may be used for the resistor $R_1$, the minimum self-holding current of the PNPN switch 1 can be reduced to a much lower level than when only a resistor is used for $dv/dt$-immunity.

The circuit configuration of an eighth embodiment of the invention is shown in FIG. 8. A PNP transistor $Q_5$ with its base connected to the anode of the PNPN switch 1 is used as a load-current-dividing transistor. The variable impedance bypass transistor $Q_6$ for $dv/dt$-immunity is driven by the PNP transistor $Q_7$ with a small current amplification factor.

An equivalent circuit diagram of a ninth embodiment of the invention is shown in FIG. 9. Reference characters $Q_1$ and $Q_2$ designate a PNP transistor and NPN transistor which constitute the PNPN switch 1, character $Q_3$ a load-current-dividing transistor of NPN type connected so as to be burdened with most of the load current, and characters $D_1$, $D_3$ and $D_4$ level-setting diodes for preventing deep saturation of the transistors. Character $I_0$ designates a load current, and character symbol $I_{BQ3}$ to cathode current of the PNPN switch 1, i.e., the base current of the transistor $Q_3$.

In the embodiment under consideration, like in the preceding embodiments, most of the load current $I_0$ flows through the collector of the transistor $Q_3$. Thus, the PNPN switch 1 can be turned off by cutting off a small current, so that a relatively small value of the gate turn-off ratio is enough for the gate turn-off-operation of the PNPN switch. Further, failure to turn off the switch which otherwise might result from the lateral effect of the P gate layer is prevented. Since the collector potential of the transistor $Q_3$ is set at almost the same level as the base potential thereof by the diode $D_4$, any deeply saturated condition is prevented. Also, the P base of the PNPN switch 1 is set at substantially the same potential as the N base by the level shift diodes $D_1$ and $D_4$. Thus, neither PNP transistor $Q_1$ nor NPN transistor $Q_2$ is deeply saturated, resulting in a higher turn-off speed than the preceding embodiments. Furthermore, by adding the diodes $D_1$, $D_3$ and $D_4$ and also by enlarging the level shift with an impedance element such as another diode, the PNPN switch is operated in an active region. The turn-off speed is increased even more by inserting, as shown in FIGS. 2 and 7, a discharging resistor (not shown in FIG. 9) between the base and the emitter of the transistor $Q_3$. In addition, in order to prevent any erroneous firing of the PNPN switch 1 due to the $dv/dt$ effect, the variable impedance circuit for $dv/dt$-immunity as shown in FIGS. 6 and 7 may be inserted between the base and the emitter of the NPN transistor $Q_2$.

The circuit configuration shown in FIG. 10 is complementary to the circuit configuration of FIG. 9, and includes a PNP transistor as the transistor $Q_3$ as in the cases of FIGS. 5 and 8. Complementary circuit configurations may be designed also for the circuits shown in FIGS. 1 to 8 respectively.

In addition, complementary circuit configurations may be designed using Darlington pair transistor connections as shown in FIGS. 11 and 12, respectively.

As will be understood from the foregoing description, it is possible according to the present invention to cut off a large load current by the small control power gate turn-off operation of an commonly-used PNPN switch or photo-thyristor without using any GTOSCR subjected to gold diffusion or having a specially designed low lateral resistance. Further, the PNPN switch according to the invention is capable of operating with a self-holding ability even at a small load current. Furthermore, the high breakdown voltage in both directions that is an advantage of the PNPN switch is not lost. Thus, a semiconductor switch circuit having high $dv/dt$-immunity and gate-firing sensitivity can be realized. Moreover, the gate turn-off speed of the semiconductor switch circuit is increased.

I claim:
1. A semiconductor switch circuit comprising:
   an input terminal to be connected to a current source;
   an output terminal to be connected to a load to which a load current is supplied from said current source;
   a transistor having a collector-emitter circuit connected between said input and output terminals for allowing said load current to flow therethrough;
   a PNPN semiconductor switch of an equivalently four-layered PNPN structure including three PN-junctions, two main electrodes and at least a gate electrode and adapted to be rendered conductive for allowing current flow between said two main electrodes or nonconductive for preventing such current flow by adjusting a gate current applied to said gate electrode; and a variable impedance bypass circuit, said variable impedance bypass circuit being connected to shunt one of said three PN-junctions at either one end of said PNPN switch, said main electrodes being connected through a base-emitter circuit of said transistor between said input and output terminals for allowing a part of said load current to flow therebetween through said base-emitter circuit when said PNPN switch is rendered conductive and for rendering said transistor nonconductive when said PNPN switch is rendered nonconductive.

2. A semiconductor switch circuit according to claim 1, further comprising another transistor connected in Darlington configuration to said transistor which is connected between said input and output terminals.

3. A semiconductor switch circuit comprising:
an input terminal to be connected to a current source;
an output terminal to be connected to a load to which a load current is supplied from said current source;
a transistor having a collector-emitter circuit connected between said input and output terminals for allowing said load current to flow therethrough;
a PNPN semiconductor switch of an equivalently four-layered PNPN structure including three PN-junctions, two main electrodes, and at least a gate electrode and adapted to be rendered conductive for allowing current flow between said two main electrodes or nonconductive for preventing such current flow by adjusting a gate current applied to said gate electrode;
a variable impedance bypass circuit, said variable impedance bypass circuit being connected to shunt one of said three PN-junctions at either one end of said PNPN switch, said main electrodes being connected through a base-emitter circuit of said transistor between said input and output terminals for allowing a part of said both currents to flow therebetween through said base-emitter circuit when said PNPN switch is rendered conductive and for rendering said transistor nonconductive when said PNPN switch is rendered nonconductive; and
an impedance element with a selected one of the two main electrodes of said PNPN switch being connected to said base-emitter circuit of said transistor, and the other one of said two main electrodes being connected through said impedance element to the collector of said transistor.

4. A semiconductor switch circuit according to claim 3, further comprising another transistor connected in Darlington configuration to said transistor which is connected between said input and output terminals.

5. A semiconductor switch circuit comprising:
an input terminal to be connected to a current source;
an output terminal to be connected to a load to which a load current is supplied from said current source;
a transistor having a collector-emitter circuit connected between said input and output terminals for allowing said load current to flow therethrough;
a PNPN semiconductor switch of an equivalently four-layered PNPN structure including three PN-junctions, two main electrodes and at least a gate electrode and being adapted to be rendered conductive for allowing current flow between said two main electrodes or nonconductive for preventing such current flow by adjusting a gate current applied to said gate electrode; and
at least two impedance elements, said main electrodes being connected through a base-emitter circuit of said transistor between said input and output terminals for allowing a part of said load current to flow therebetween through said base-emitter circuit when said PNPN switch is rendered conductive and for rendering said transistor nonconductive when said PNPN switch is rendered nonconductive, and wherein one of said main electrodes of said PNPN switch is an anode electrode and the other of said main electrodes is a cathode electrode and wherein said gate is a cathode gate, with said respective impedance elements being connected between the anode of said PNPN switch and the collector of said transistor and between the cathode gate of said PNPN switch and the collector of said transistor, respectively.

6. A semiconductor switch circuit according to claim 5, further comprising another transistor connected in Darlington configuration to said transistor which is connected between said input and output terminals.

7. A semiconductor switch circuit comprising:
an input terminal to be connected to a current source;
an output terminal to be connected to a load to which a load current is supplied from said current source;
a transistor having a collector-emitter circuit connected between said input and output terminals for allowing said load current to flow therethrough;
a PNPN semiconductor switch of an equivalently four-layered PNPN structure including three PN-junctions, two main electrodes and at least a gate electrode and being adapted to be rendered conductive for allowing current flow between said two main electrodes or nonconductive for preventing such current flow by adjusting a gate current applied to said gate electrode; and
at least two impedance elements, said main electrodes being connected through a base-emitter circuit of said transistor between said input and output terminals for allowing a part of said load current to flow therebetween through said base-emitter circuit when said PNPN switch is rendered conductive and for rendering said transistor nonconductive when said PNPN switch is rendered nonconductive, and wherein one of said main electrodes is the cathode of said PNPN switch and the other of said main electrodes is the anode of said PNPN switch and the gate electrode of said PNPN switch is an anode gate, said respective impedance elements being connected between the cathode of said PNPN switch and the collector of said transistor and between the anode gate of said PNPN switch and the collector of said transistor, respectively.

8. A semiconductor switch circuit according to claim 7, further comprising another transistor connected in Darlington configuration to said transistor which is connected between said input and output terminals.

* * * * *